United States Patent [19]
Bobbitt et al.

[11] Patent Number: 5,404,584
[45] Date of Patent: Apr. 4, 1995

[54] PRINTED CIRCUIT BOARD HAVING MODULARIZED CIRCUIT FUNCTIONS DESIGNED FOR EARLY DIAGNOSTICS

[75] Inventors: Donald W. Bobbitt; David C. Bing, both of Forest, Va.

[73] Assignee: Ericsson GE Mobile Communications Inc., Lynchburg, Va.

[21] Appl. No.: 562,846

[22] Filed: Aug. 6, 1990

[51] Int. Cl.6 ............................................. H04B 17/00
[52] U.S. Cl. .................................. 455/115; 455/226.1; 455/349; 324/158.1
[58] Field of Search ................. 455/348, 349, 67, 115, 455/226, 67.1, 226.1; 371/22.6, 22.1, 15.1; 324/158, 158 F

[56] References Cited

U.S. PATENT DOCUMENTS

| | | | |
|---|---|---|---|
| 4,196,386 | 4/1980 | Phelps | 371/22.6 |
| 4,667,403 | 5/1987 | Edinger et al. | 29/840 |
| 4,717,989 | 1/1988 | De Barros et al. | 361/424 |
| 4,719,694 | 1/1988 | Herberich et al. | 29/703 |
| 4,792,939 | 12/1988 | Hikita et al. | 370/24 |
| 4,835,846 | 6/1989 | Juan et al. | 29/840 |
| 4,843,588 | 6/1989 | Flynn | 364/900 |
| 4,907,230 | 3/1990 | Heller | 371/22.1 |
| 4,918,691 | 4/1990 | Chall | 371/15.1 |
| 5,127,009 | 6/1992 | Swanson | 371/22.6 |

FOREIGN PATENT DOCUMENTS

| | | | |
|---|---|---|---|
| 2723705 | 12/1978 | Germany | 455/67 |
| 3231952 | 3/1984 | Germany | 455/349 |

*Primary Examiner*—Edward F. Urban
*Attorney, Agent, or Firm*—Nixon & Vanderhye

[57] ABSTRACT

An apparatus and method of modular electronic printed circuit board design for a radio communication transceiver in which the electronic circuitry forming a transmit/receive circuit board of the device is modularized in such a manner as to facilitate independent stand-alone functional testing of modules both on and off the board.

2 Claims, 8 Drawing Sheets

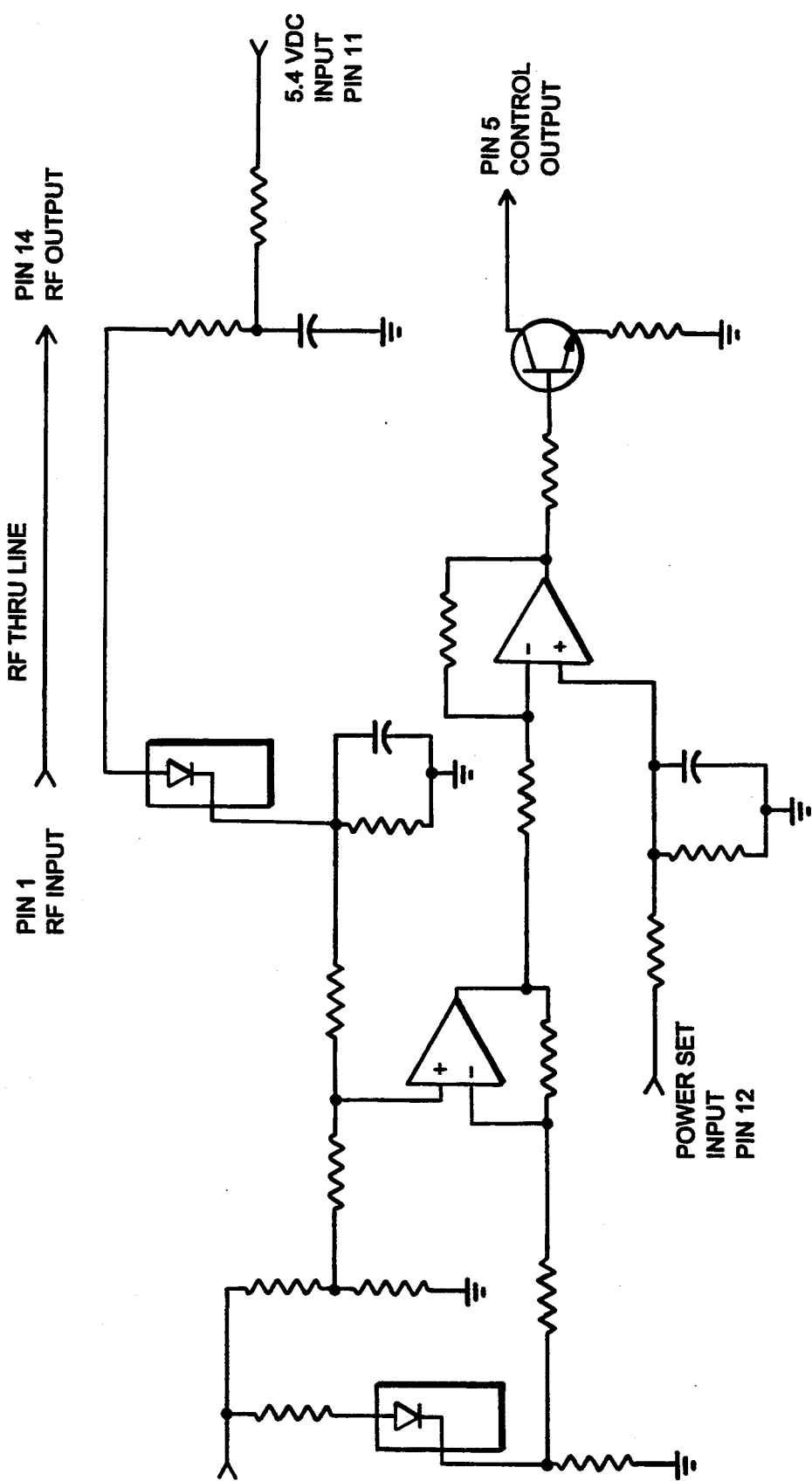
Fig. 3   POWER CONTROL MODULE

Fig. 4 IF AMP MODULE
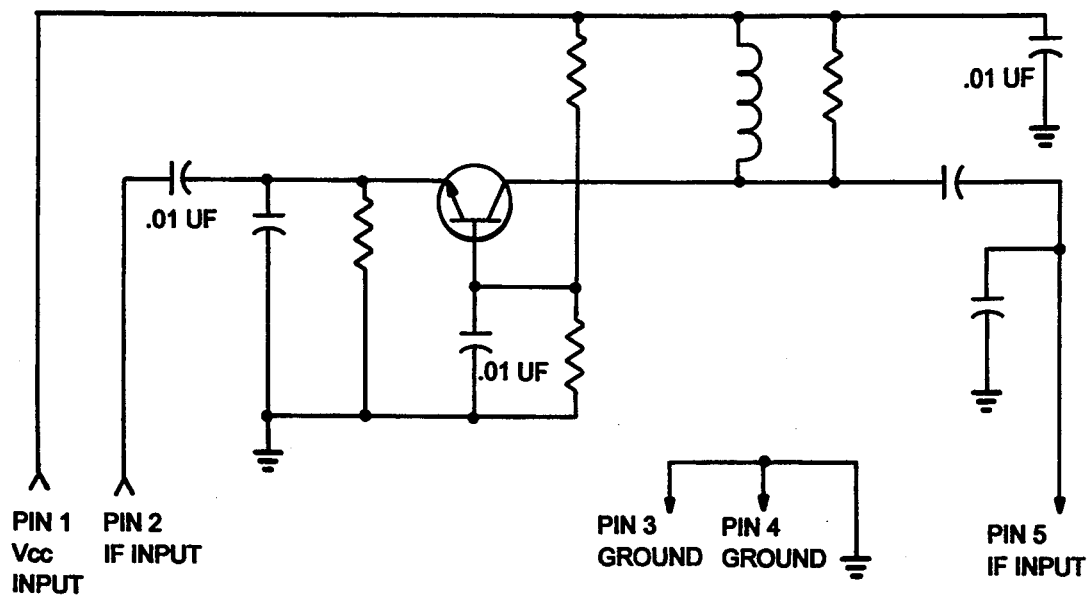
Fig. 5 NOTCH FILTER MODULE
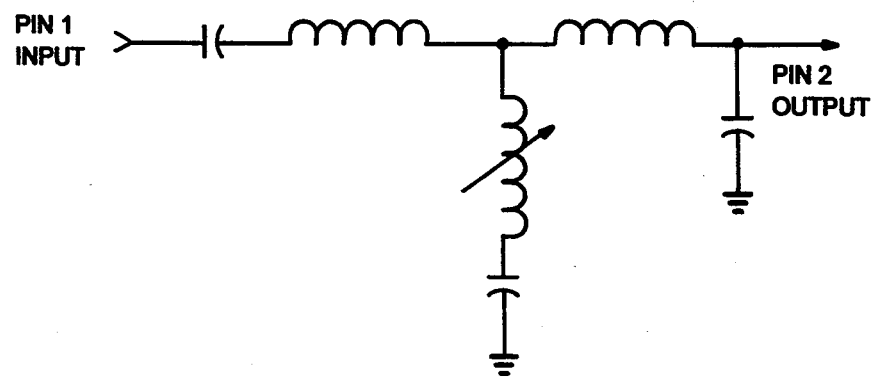

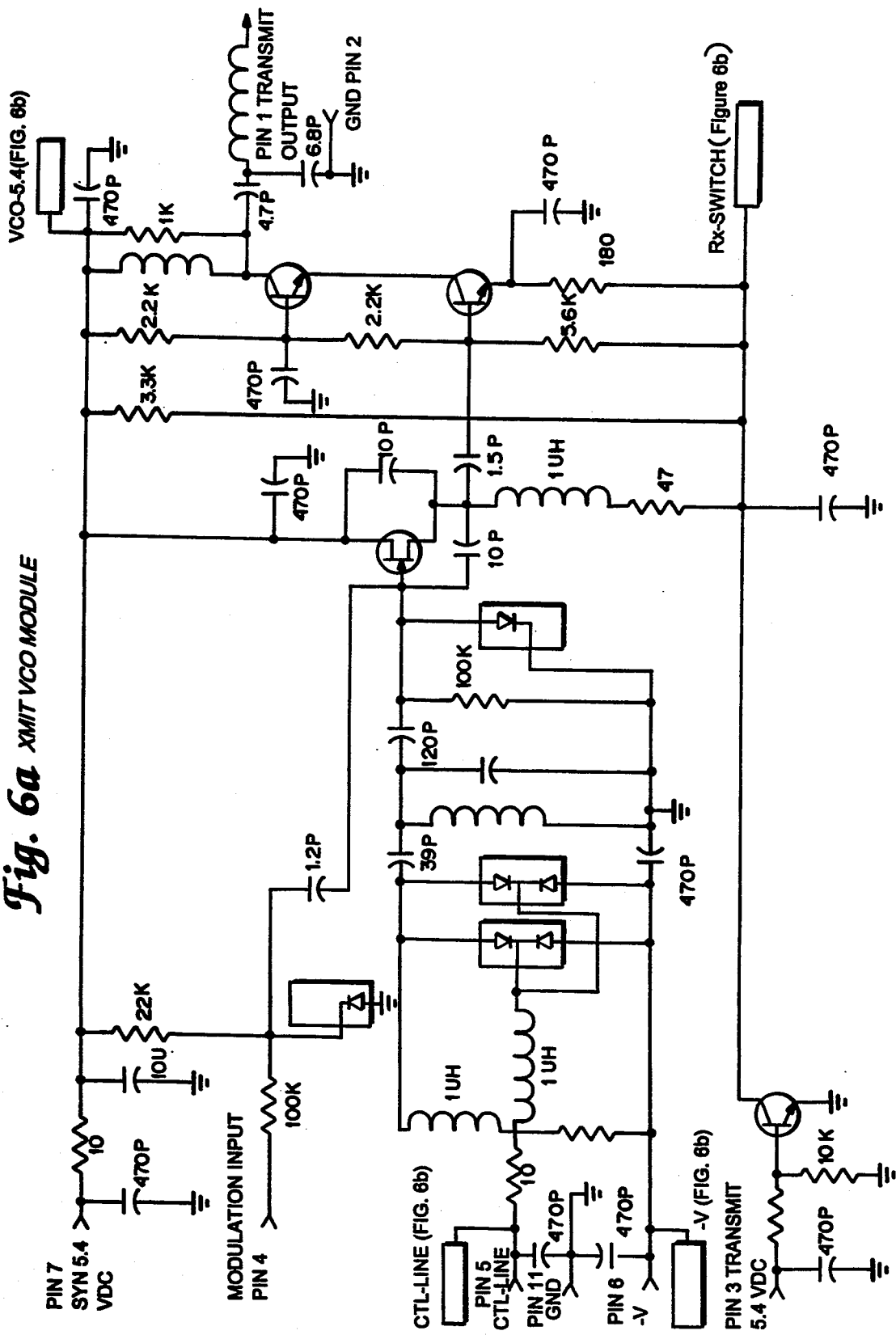

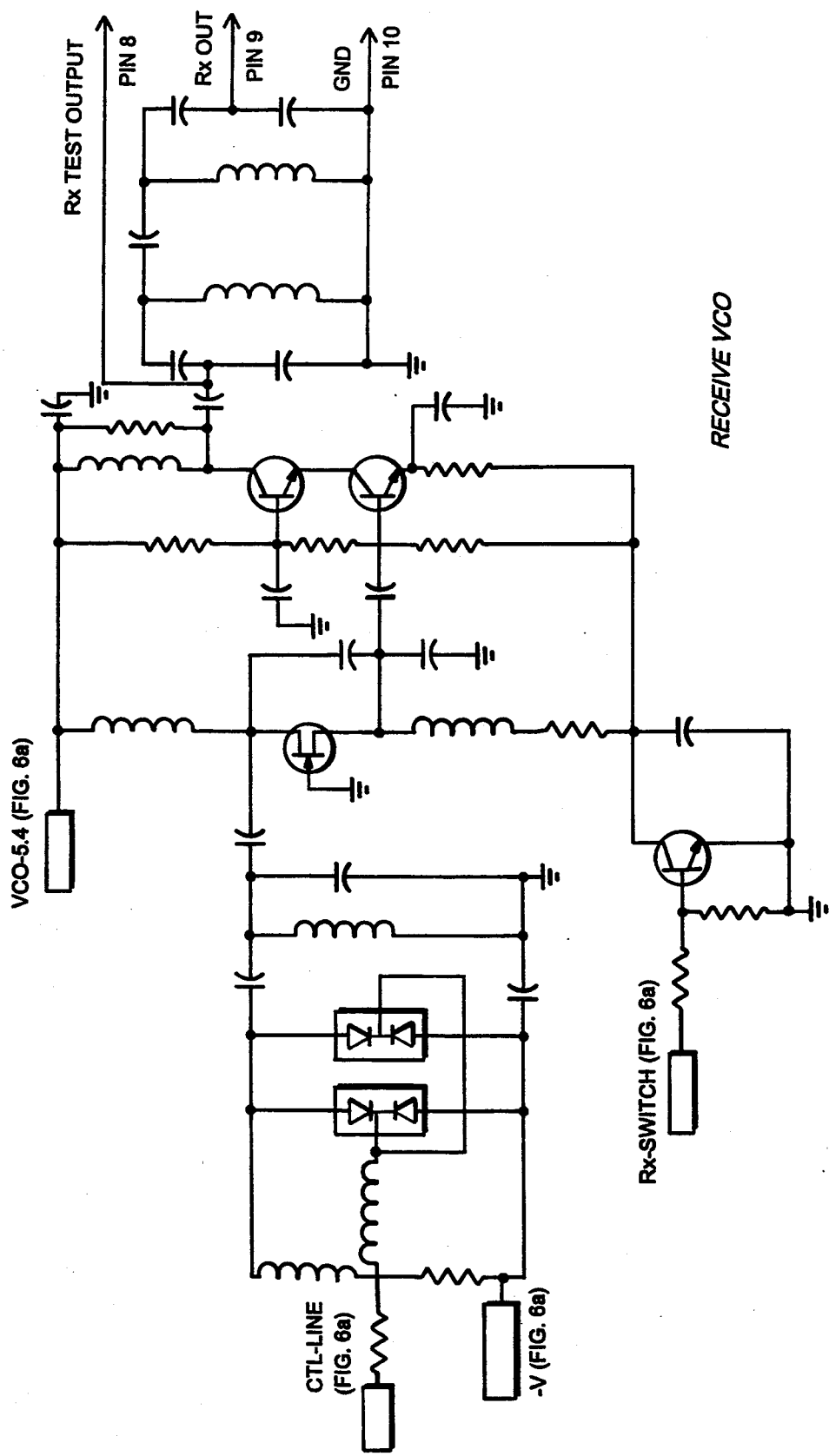
Fig. 6b  RECEIVE VCO MODULE

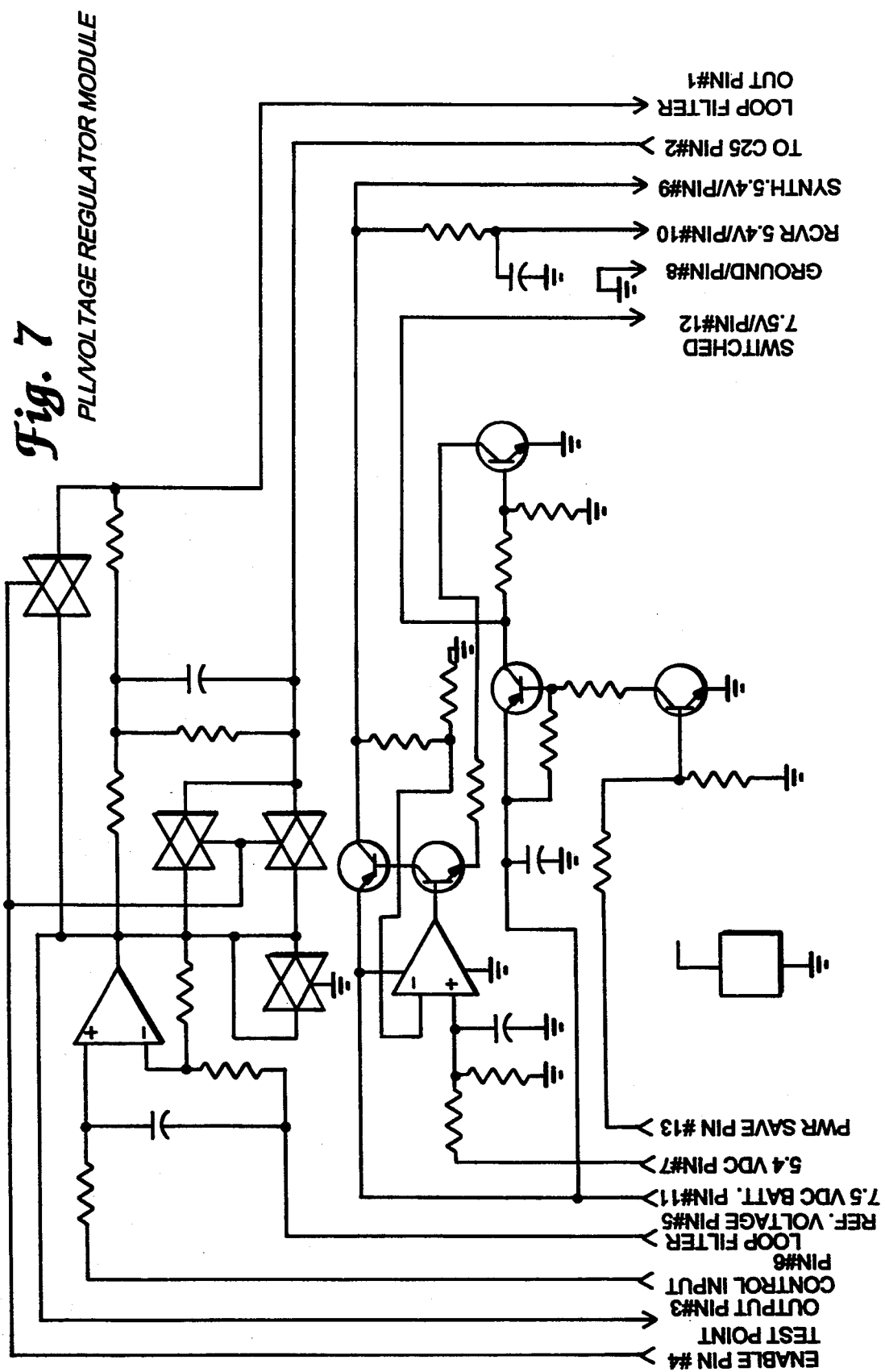
Fig. 7 PLL/VOLTAGE REGULATOR MODULE

PRINTED CIRCUIT BOARD HAVING MODULARIZED CIRCUIT FUNCTIONS DESIGNED FOR EARLY DIAGNOSTICS

FIELD OF THE INVENTION

The field of the present invention is electronic printed circuit board design and circuit modularization for radio transceivers, which allows automatic diagnostic analysis and replacement of bad modules.

BACKGROUND AND SUMMARY OF THE INVENTION

Disclosed is a method of electronic printed circuit board and module design which allows for several levels of automatic diagnostic analysis and subsequent identification of potentially bad modules when the main board fails first level tests.

1. Description of the Prior Art

Modern printed circuit boards in electronic equipment are designed to provide adequate access for tests of the assembled board itself. However, when these assembled boards fail tests, they then require an added level of manual diagnostic testing, performed by a technician at another test position. This technician must be trained in the proper functioning of the circuitry of the board, and typically may require a substantial period of time to perform the trouble diagnosis by confirming the failure of the unit and determining its probable cause.

It is known in the prior art to modularize particular functions of electronic devices, such as radio transceivers, in order to miniaturize the physical size of the device package as required, for instance, in field applications. For example, U.S. Pat. No. 4,792,939 to Hikita et al describes modularizing the duplexer and its functional subcircuits as well as the power amplifier of a radio transceiver in order to drastically reduce the volume occupied by the device.

A problem with the modular construction of the printed circuit boards of the prior art, however, is that they typically contain functional circuitry which, as assembled on a board, cannot be independently tested as individual or unique functional building blocks of the device. One functional building block, for example, may be spread out over several modules or discrete elements of circuitry. Moreover, there are no known methods for designing functional stand-alone circuits which can be tested on or off the board as individual functional modules.

A need in the prior art therefore exists for a printed circuit board having modules of circuitry making up discrete functional building blocks of an electronic device where the blocks can be tested as stand-alone modules for unique functions either on or off the circuit board.

2. Summary of the Invention

Disclosed is an apparatus and method of modular electronic printed circuit board design for a radio communications transceiver in which the electronic circuitry forming the functional building blocks of the device is individually modularized to facilitate independent stand-alone functional testing both on and off the board.

In an exemplary embodiment, a transmitter/receiver board uses modular circuitry for the major functions of the transmitter and receiver in such a manner as to provide access for automated tests and diagnostics of the board modules when tests of the board indicate a failure to obtain acceptable product specifications. Preferably, each module is designed to contain all of the circuitry needed to perform each major or unique function of the exemplary radio transceiver.

The board preferably has test connections accessible from the bottom of the board for "pressure pin" contacts of the automatic test equipment. Each of the module's input and output connections are directly accessible from the bottom of the board or via through-hole connections on the board.

The modularity feature not only permits module testing prior to mounting on a board, but also allows the completed boards to be automatically tested and diagnosed to a degree where it can be determined which, if any, module has failed. Thus the feature provides access to the board for testing and also provides for a second level of test and diagnostics not found in the prior art.

The exemplary embodiment of the present invention also eliminates the need for a specially trained technician to diagnose the cause of test failures, which further eliminates the need to invest in the additional test equipment such a technician would require to diagnose the cause of many kinds of failures.

Additionally, the exemplary embodiment of the present invention provides fast and repeatable automatic diagnosis of test failures, and determines the module which most likely caused a given test failure. Such determinations and subsequent module replacement will thus allow increased yields for the completed transceiver boards and reduced manufacturing costs.

By designing the printed circuit boards to utilize modular circuitry of the nature disclosed, the automated test systems are then able to project the cause of the failure without the additional human intervention that is present with other products. Moreover, failed circuit boards are easily repaired, thus increasing the yield of usable boards.

BRIEF DESCRIPTION OF THE DRAWINGS

FIG. 3 is a schematic diagram of the circuitry in the power control module of the present invention;

FIG. 4 is a schematic diagram of the circuitry of the IF amplifier module of the present invention;

FIG. 5 is a schematic diagram of the circuitry of the notch filter module of the present invention;

FIGS. 6a and 6b are schematic diagrams of the voltage controlled oscillator (VCO) module of the present invention;

FIG. 7 is a schematic diagram of the Phase Lock Loop (PLL)/Voltage Regulator module of the present invention;

DETAILED DESCRIPTION OF THE PREFERRED EXEMPLARY EMBODIMENTS

Figure 1:
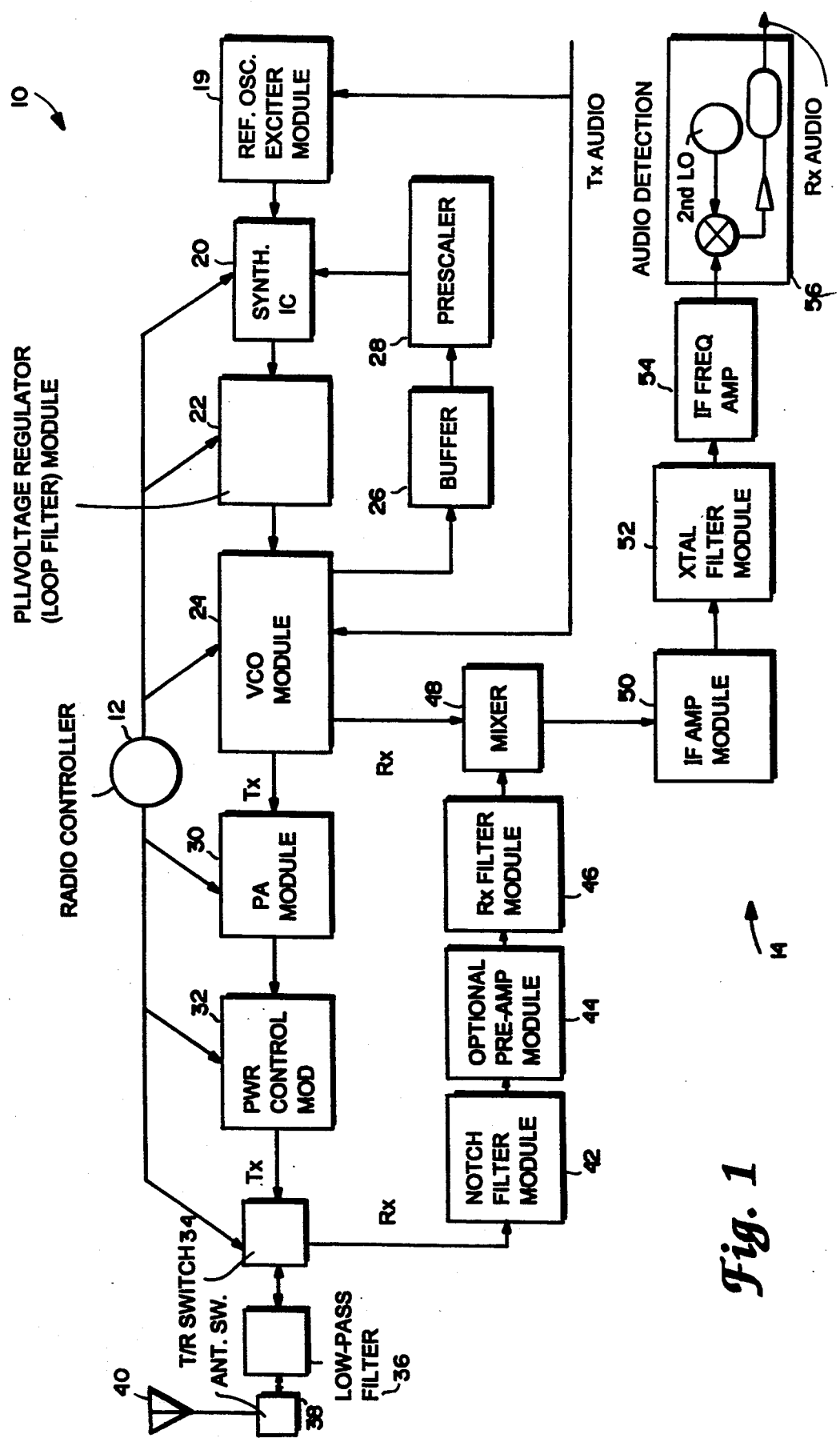
FIG. 1 is a functional block diagram of the circuitry found on the transceiver circuit board of the present invention.

As shown in FIG. 1, a series of modules are employed on a printed circuit board of the present invention and form the functional building blocks of a synthesized, wideband FM personal radio transceiver 10. In the preferred embodiment, transceiver 10 is capable of being programmed for multiple channel operation and is divided into two major assemblies: controller assembly 12 and transmit/receive (T/R) assembly 14.

Figure 2:
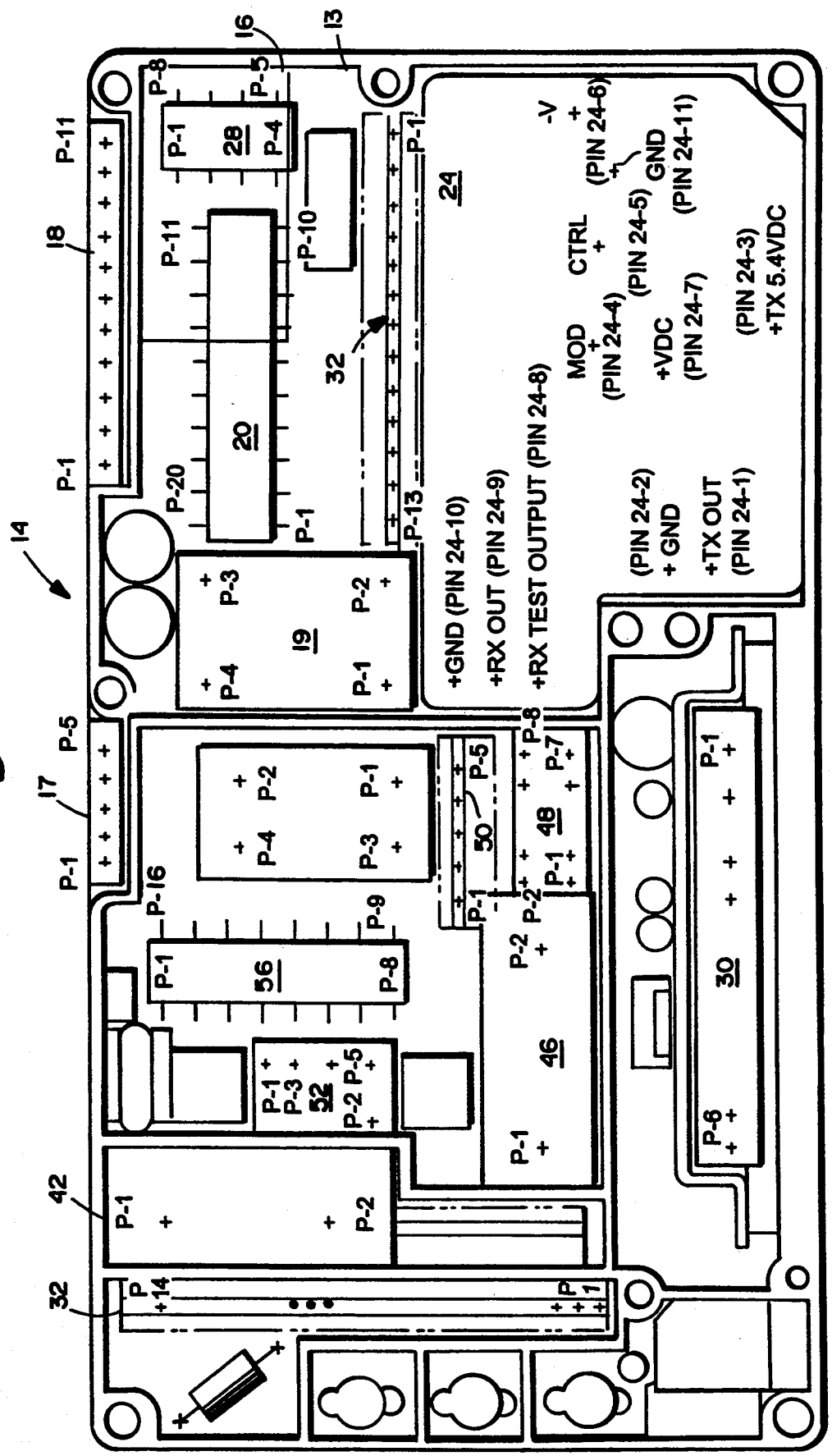
FIG. 2 is a plan view of the component side of the circuit board of the present invention.

Controller assembly 12 may contain a micro-computer, memory and audio processing circuitry capable of being programmed for multiple channel operation, specific RF power levels and deviations, channel guard tones and the like. The front cover (not shown) of radio transceiver 10 contains the channel display, operator controls, battery connections, and the input/output test connector, as well as the connections necessary to control the transmit/receive assembly T/R assembly 14 consists of circuit board 16, as shown in FIG. 2, a shield 13 and the back cover (not shown) of the radio 10. The transmit and receive structures are limited to the circuit board 16 itself and are connected to controller assembly 12 via two connectors 17 and 18. T/R board 16 also houses the antenna connector (not shown) for RF input to the receiver and output from the transmitter.

As shown in FIG. 1, the audio signal to be transmitted is input to reference oscillator exciter module 19, which sends the signal to synthesizer integrated circuit (IC) 20, which in turn sends the signal to loop filter module 22 and on to one input of voltage-controlled oscillator (VCO) module The original audio signal also appears at another input of VCO module 24. Additionally, a feedback loop is made up of VCO module 24, buffer 26, prescaler 28, synthesizer IC 20, and loop filter (PLL) module 22.

In the transmit mode, the output of VCO module 24 is sent to PA module 30, then to power control module 32, transmit/receive (T/R) switch low-pass filter 36, antenna switch 38 and on to antenna 40. In the receive mode a modulated signal is received by antenna 40 and sent to antenna switch 38, low pass filter 36, and T/R switch 34. T/R switch 34 routes the incoming signal to notch filter module 42, optional pre-amp module 44, and receive filter module 46. The signal is then mixed with one output of VCO module 24 in mixer module 48, and further sent to intermediate frequency (IF) amplifier module 50, crystal filter module 52, IF frequency amplifier 54, and then detected by audio detector module 56 to output a received audio signal.

In the simplex, dual conversion radio communications transceiver thus structured, T/R switch 34 controls whether a transmit or receive mode is selected at any one time, thus allowing utilization of a single antenna. Since the construction of the above-recited combination of elements and its operation is well known, further detailed description has been omitted.

FIGS. 3-7 illustrate how major components of FIG. 1 can be modularized. That is to say, FIGS. 3-7 show schematic diagrams of exemplary modular circuits including the power control module 32, IF amplifier module 50, notch filter module VCO module 24 and PLL/Voltage Regulator (loop filter) module 22, all operable as described above. The schematics of the remaining components of the transceiver are well known in the art and may be modularized in the manner shown in FIG. 1.

In addition to illustrating schematics of exemplary FIG. 1 modules, FIGS. 3-7 also indicate the pin locations of the various input/output signals as they appear on the circuit board of FIG. 2 for test purposes. For example, FIGS. 6a and 6b illustrate the transmit and receive sections, respectively, of the VCO module 24, and the pin locations indicated in the figures may be located for test purposes on the circuit board 16 in the exemplary fashion shown for element 24 in FIG. 2. Similar exemplary pin placements for testing other modular elements are also shown in FIG. 2.

As will be appreciated by the artisan, modularization of circuitry and accessible pin placement in the manner taught above permits module testing both before and after mounting on the board. Thus, automatic testing and diagnosis can be obtained in such a manner as to eliminate the need for highly trained circuit board repair personnel while at the same time increasing the yield of usable completed transceiver boards.

Figure 8:
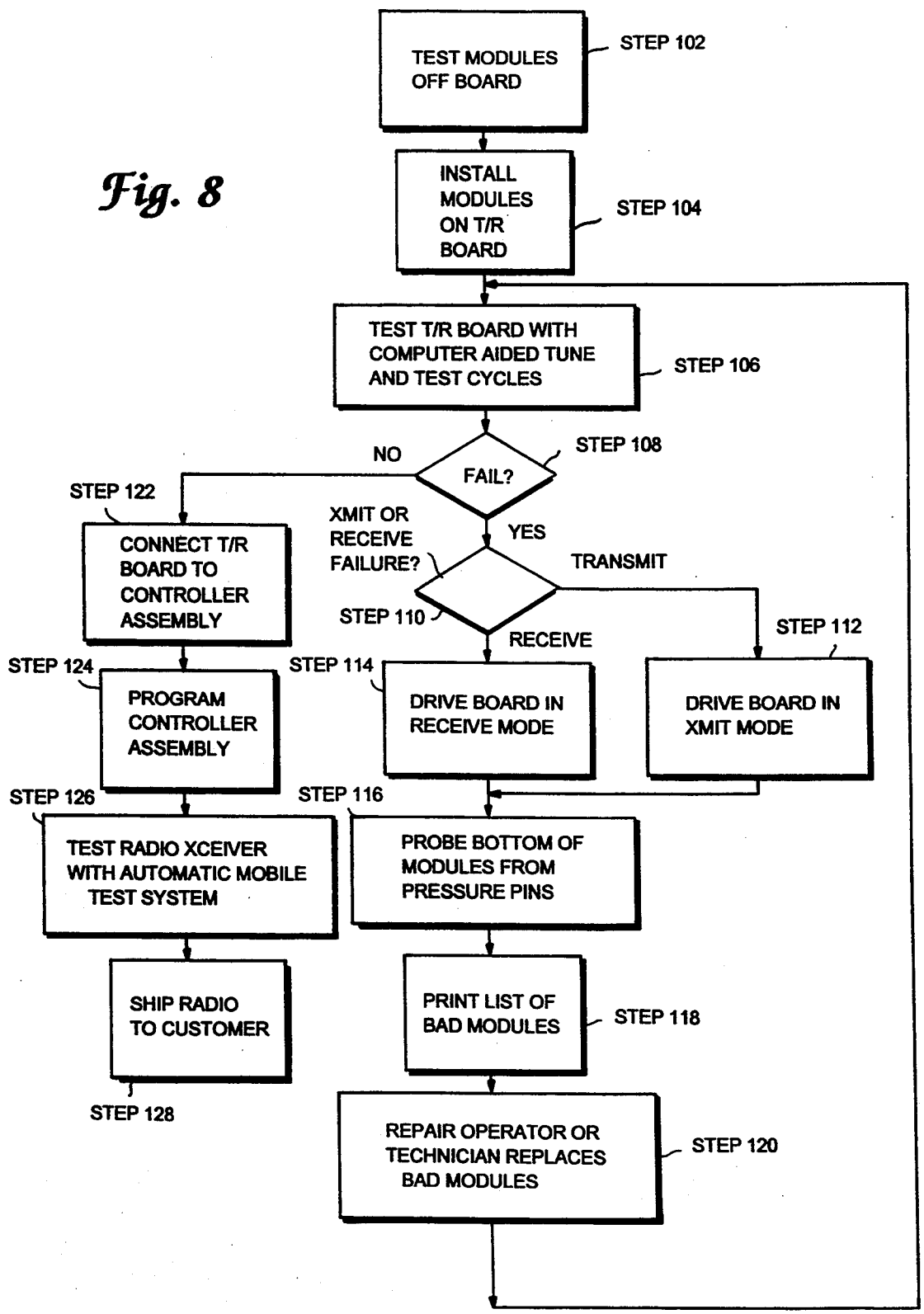
FIG. 8 is a flow chart of the testing method for the board and module design of the present invention.

Such beneficial results can be obtained via the flowchart procedure of FIG. 8 which describes the design and testing method for the preferred exemplary embodiment of the present invention utilizing the above-described functional modularity.

As shown in FIG. 8, the modules are each automatically and individually tested at step 102 before being secured to board 16 (step 104). Thereafter, the circuit boards and in some instances the individual modules secured thereto are tested for proper functioning as follows:

Known automatic test equipment comprising a computer controlled rack of buss-controlled test equipment is programmed at a first test level to perform typical FM radio measurements as well as other analog and digital tests in a tune and test cycle at step 106. The FM radio measurements are performed utilizing the antenna connector as well as the control and monitoring lines of connectors 17,18. These connectors 17,18 are accessed via a test fixture which contains pressure pins which contact the patterns on the bottom of the board when it is inserted into the fixture. The pressure pins are wired to a connector cable which in turn routes the test signals to the equipment in the test system. The following conventional measurements are performed:

1. Idle current of the board;
2. Synthesizer lock;
3. Frequency error;
4. Transmitter power (across the band);
5. Transmitter deviation (across the band);
6. IF frequency deviation;
7. Receiver audio level;
8. Receiver sinad (across the band);
9. Receiver audio distortion;
10. Receiver current; and
11. Receiver hum and noise.

These tests for determining whether a typical FM radio is performing in accordance with the product specifications, are well known to those skilled in the art and will therefore not be further described.

The test fixture will additionally include pressure pins placed so as to connect to the necessary input and output pins of the modules on T/R board 16. In this regard, when one of the boards fails to meet the product's specifications (step 108), the control software for the test system then steps to a second level of testing whereby the failures are analyzed for a determination of whether a transmit or receive path failure has occurred (step 110). Once this is determined, the test system proceeds to drive and monitor T/R board 16 in either the transmit mode (step 112) or the receive mode (step 114).

The test fixture using the above noted module input/output pins then measures the input and output signals from the modules in the selected path and compares the readings taken with a table of acceptable limits for each module (step 116). Presuming that a given module has all input signals within limits, but has output signals that are outside acceptable limits, then the test fixture prints a listing of the tests performed, the readings taken, and the module(s) that needs to be replaced (step 118). The repair operator can then, with a high degree of confidence, replace the indicated module at step 120 without having a technician trouble-shoot T/R board 16 at another test position.

The testing procedure can then begin anew at step 106 with the testing of another or the repaired T/R board 16.

As additionally shown in FIG. 8, if no failure occurs at step 108, T/R board 16 is then connected to controller assembly 12 at step 122. Controller assembly 12 is then programmed (step 124) and the assembled radio transceiver 10 is tested as a completed unit at step 126 by an automatic mobile test system. If this final test is passed, transceiver 10 is then finally shipped to the customer at step 128.

In light of the above, it may be seen that by designing the transceiver board to utilize modular circuitry, automated test systems may be applied not only to the assembled boards to detect faulty boards, but such design allows further tests to determine the cause of the failure without requiring additional human intervention. In this manner, increased yields of usable completed transceiver boards and reduced manufacturing costs are obtained.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A printed circuit board for a radio communication transceiver having electronic transmitter and receiver components secured to the board, the improvement comprising:
    a plurality of modules, wherein each said module is functionally unique and contains substantially all of the circuitry required to perform one of the major functions of the transmitter or receiver components, said modules including a voltage controlled oscillator module, a power amplifier module, a power control module and a phase-locked loop voltage regulator module,
    plural connecting elements for securing each of said modules to the circuit board, wherein the electrical and physical arrangement of said modules and connecting elements on said board are such that electrical testing of the unique function of each said module can be performed independently of the remaining said modules, and
    wherein said connecting elements extend through said board to form a plurality of test connections for connection to automatic test equipment for individually testing said major functions.

2. An improved printed circuit board as in claim 1, wherein said modules further include:
    a notch filter module;
    a receive filter module;
    an intermediate frequency amplifier module, and
    a crystal filter module.

* * * * *